(12) United States Patent
Cyman et al.

(10) Patent No.: US 6,320,556 B1
(45) Date of Patent: Nov. 20, 2001

(54) RFID FOIL OR FILM ANTENNAS

(75) Inventors: Theodore F. Cyman, Grand Island, NY (US); Dennis Nachtwey, Green Bay, WI (US); Adele C. Shipston, Williamsville, NY (US)

(73) Assignee: Moore North America, Inc., Grand Island, NY (US)

( * ) Notice: Subject to any disclaimer, the term of this patent is extended or adjusted under 35 U.S.C. 154(b) by 0 days.

(21) Appl. No.: 09/487,181

(22) Filed: Jan. 19, 2000

(51) Int. Cl.$^7$ ............................................. B44C 1/16
(52) U.S. Cl. ............................................ 343/873; 156/233
(58) Field of Search ......................... 343/873, 700 MS, 343/706; 235/488; 156/233, 234, 238

(56) References Cited

U.S. PATENT DOCUMENTS

| | | | |
|---|---|---|---|
| 4,204,213 | 5/1980 | Wheeler | 343/706 |
| 4,376,151 | 3/1983 | Parrotta | 428/323 |
| 5,041,788 | 8/1991 | Kontor et al. | 324/318 |
| 5,223,801 | 6/1993 | Bergman | 331/76 |
| 5,520,763 | * 5/1996 | Johnstone | 156/233 |
| 5,528,222 | 6/1996 | Moskowitz et al. | 340/572 |
| 5,786,626 | 7/1998 | Brady et al. | 257/673 |
| 6,094,138 | * 7/2000 | Eberhardt et al. | 340/572.1 |
| 6,100,804 | * 8/2000 | Brady et al. | 340/572.7 |

FOREIGN PATENT DOCUMENTS 0 274 592   7/1988   (EP) .

OTHER PUBLICATIONS

Patent Abstacts of Japan vol. 1996, No. 7, Jul. 31, 1996 and JP 08078945, Mar. 22, 1996.

* cited by examiner

Primary Examiner—Don Wong
Assistant Examiner—James Clinger
(74) Attorney, Agent, or Firm—Nixon & Vanderhye PC

(57) ABSTRACT

A radio frequency antenna-containing element with good flexibility and bend properties is produced utilizing a flexible substrate, an adhesive, and a conductive foil or film. The adhesive and conductive foil or film are applied to the substrate so that they have the configuration of an RF antenna. This facilitates a method of making such an element in a high speed and in a simple manner that will function well, can be aesthetic or convey information as well as being functional, and with other optimum properties.

19 Claims, 2 Drawing Sheets

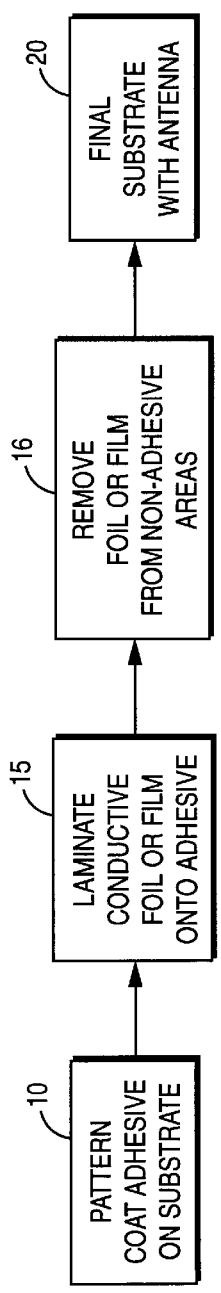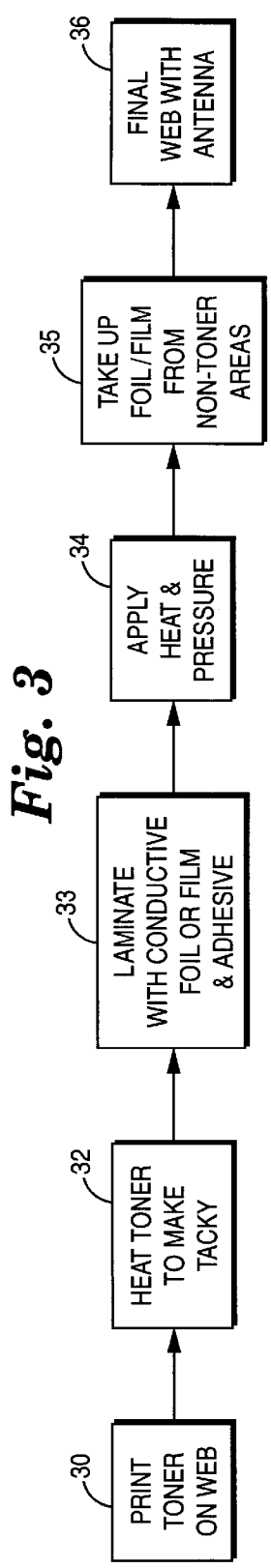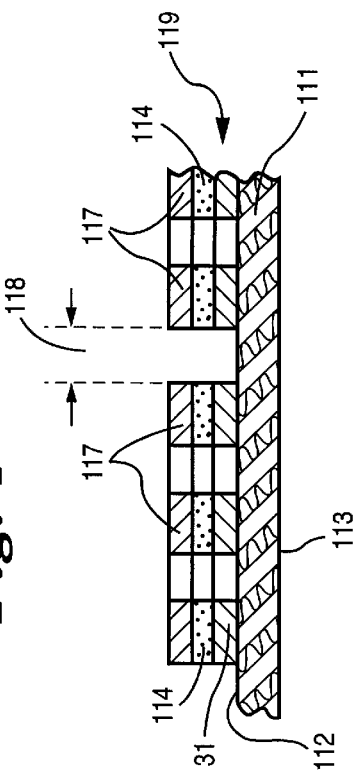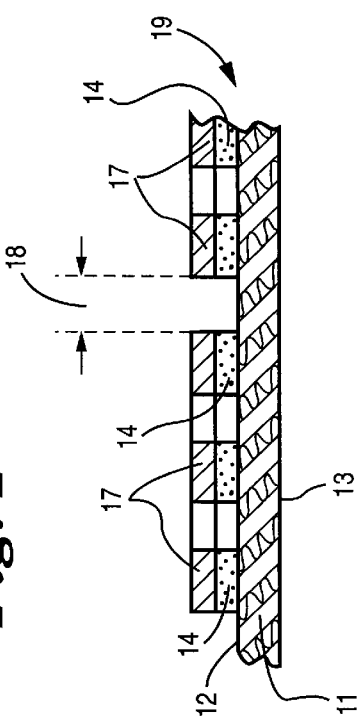

RFID FOIL OR FILM ANTENNAS

BACKGROUND AND SUMMARY OF THE INVENTION

More and more products are desirably including radio frequency (RF) circuits associated therewith. An important element of such RF circuits is an RF antenna, which must have a configuration where two substantial bodies of conductive material are properly spaced from each other so as to define two antenna portions which are bridged by a circuit chip comprising an RF transponder. The antennas are typically produced by utilizing conductive ink (such as shown in co-pending application Ser. No. 09/408,519 filed Sep. 29, 1999, the disclosure of which is hereby incorporated by reference herein) and in which the conductive ink can be printed as numbers or letters or in some other configuration that is aesthetic, or, such as shown in U.S. Pat. Nos. 5,223,801 and 5,786,626 (the disclosures of which are hereby incorporated by reference herein). The antenna may be in the form of etched or stamped conductive foil. While products made from such structure function properly, the conductive ink does not provide a high grade antenna since it cannot be as thick or as conductive, in general, as can a conductive foil. On the other hand the conventional etching or stamping techniques for applying foil do not lend themselves to high speed production, and do not allow the variability in the configuration of the antenna that is often desired so that the antenna itself is aesthetic or conveys information, rather than standing out as a solely functional item.

According to the present invention the above mentioned problems are solved by applying a conductive foil or a film to a substrate in such a way that a high grade antenna for RFID transmission is provided yet can be produced quickly and inexpensively and in a manner which is aesthetic or conveys information. According to one aspect of the present invention, the process and equipment disclosed in U.S. Pat. No. 5,520,763 (the disclosure of which is hereby incorporated by reference herein) may be utilized to produce the antenna, or according to another aspect of the present invention an even more simplified construction may be provided.

According to one aspect of the present invention there is provided a radio frequency antenna-containing element comprising: A flexible substrate having a top surface. Adhesive in a radio frequency antenna configuration operatively connected to the top surface. A conductive foil or film operatively connected to the adhesive so as to have substantially the same configuration thereof, and on the opposite side of the adhesive from the top surface. And, the conductive foil or film having a radio frequency antenna configuration and the substrate with the adhesive and foil or film being flexible and bendable without destroying the substrate or antenna configuration of the foil or film.

The substrate preferably comprises paper, thin sheets of plastic, or like materials. For example a particularly desirable substrate is conventional card stock paper, although bond paper, or paper heavier than card stock, may also be utilized. Readily bendable polypropylene or polyolefin sheets having a thickness approximately that of bond paper also may be utilized. Preferably the substrate has the appropriate flexibility and bendability properties so that it may be readily handled in web form, and relatively high speed equipment, so that radio frequency antenna-containing elements according to the invention may be produced at web speeds of at least 50 feet per minute, and preferably over about 100 feet per minute.

The adhesive may comprise either permanent or removable hot melt pressure sensitive adhesive and in one preferred embodiment the adhesive is substantially directly adhered to the substrate and the conductive foil or film. The adhesive coat weight may be between about 3–6 pounds per 17 inch by 22 inch by 500 sheet ream of substrate (that is 3–6 pounds per surface area which is 17 inches by 22 inches times 500). The conductive foil or film may have a thickness of between about 0.3–1 mil and may have a wide variety of metallic colors. The adhesive and conductive foil or film configurations preferably have the configurations of letters or numbers so that they can convey information, or are otherwise in aesthetic patterns which do not allow an observer to easily discern that the foil or film is an RF antenna.

Alternatively, pursuant to the procedures in, and utilizing the equipment such as shown in, U.S. Pat. No. 5,520,763, toner may be printed onto the substrate, preferably when it is in the form of a web, so that the toner is disposed between the substrate top surface and the adhesive, the toner also having substantially the same configuration as the adhesive and conductive foil or film, such as described above.

According to another aspect of the present invention there is provided a method of making a radio frequency antenna-containing element comprising: (a) Applying a pressure sensitive adhesive substantially directly to the top surface of a flexible substrate so that the adhesive is in the form of a pattern of a radio frequency antenna. (b) Laminating a conductive foil or film to the adhesive on the top face of the substrate. And, (c) removing the conductive foil or film from the top face of the substrate except for where the conductive foil or film adheres to the adhesive, to produce a flexible substrate having a flexible radio frequency antenna adhered thereto.

In the implementation of the method described above preferably (b) and (c) are practiced by bringing a sheet or web of the conductive foil or film into secure contact with the adhesive, and then taking up the web or sheet so that the portions of the web or sheet not engaging the adhesive are torn away from those portions of the web or sheet that do engage the adhesive. Also preferably (a) is practiced by applying a hot melt adhesive at a coat weigh of between about 3–6 pounds per 17 inch by 22 inch by 500 sheet ream of substrate, and also preferably (b) is practiced utilizing a conductive foil or film having a thickness of about 0.3–1 mil. In one preferred embodiment (a)–(c) are practiced so as to apply the adhesive and conductive foil or film so that they have the configurations of letters or numbers; or so that the conductive foil or film otherwise is not readily discernible as a functioning RF antenna.

The method of the invention may also include providing other RF circuit elements, such as an RF chip, in operative association with the antenna, such as is conventional or as shown in U.S. application Ser. No. 09/393,291 filed Sep. 10, 1999, and if it is desired that the element produced be a label or the like, pressure sensitive adhesive can be applied to the bottom surface of the substrate and may be covered by a release liner.

Also in the practice of the method (b) may be practiced to unwind a web of conductive foil or film to bring the web of conductive foil or film into contact with the adhesive, and (c) may be practiced to rewind the web of conductive foil or film so that the portions of the web not engaging the adhesive are torn away from those portions of the web that do engage the adhesive.

According to another aspect of the present invention, utilizing the basic procedures and equipment as disclosed in U.S. Pat. No. 5,520,763, there is provided a method of making a radio frequency antenna-containing element comprising: (a) Printing a toner on the top surface of a flexible substrate so that the toner is in the form of a pattern of a radio frequency antenna. (b) Heating the toner to make it tacky. (c) While the toner is tacky, applying a laminate of a conductive foil or film and adhesive onto the toner while heating and applying pressure, so that the adhesive and foil stick to the toner where they engage. And, (d) removing the laminate from the substrate except for where the conductive foil or film and adhesive adhere to the toner, to produce a flexible substrate having a flexible radio frequency antenna operatively adhered thereto.

In this aspect of the invention preferably (a)–(d) are preferably practiced so as to apply the adhesive and conductive foil or film so that they have the configurations of letters or numbers. Also preferably according to this aspect (c) is practiced to unwind a web of a laminate of adhesive and conductive foil or film to bring the web into contact with the tacky toner, and (d) is practiced to rewind the laminate web so that the portions of the web not engaging the toner are torn away from those portions of the web that do engage the toner.

It is the primary object of the present invention to be able to easily and quickly produce an element having a high grade antenna for RFID transmissions. This and other aspects of the invention will become clear from an inspection of the detailed description of the invention and from the appended claims.

BRIEF DESCRIPTION OF THE DRAWINGS

FIG. 1 is a box diagram showing a first exemplary method according to the present invention;

FIG. 2 is a longitudinal cross-sectional view, with the dimensions of the components exaggerated for clarity of illustration, of an exemplary RF antenna-containing element produced according to the method of FIG. 1;

FIG. 3 is a view like that FIG. 1 for a second embodiment of an exemplary method according to the present invention;

FIG. 4 is a view like that of FIG. 2 only for an RF antenna-containing element produced pursuant to the method of FIG. 3;

DETAILED DESCRIPTION OF THE DRAWINGS

Figure 5:
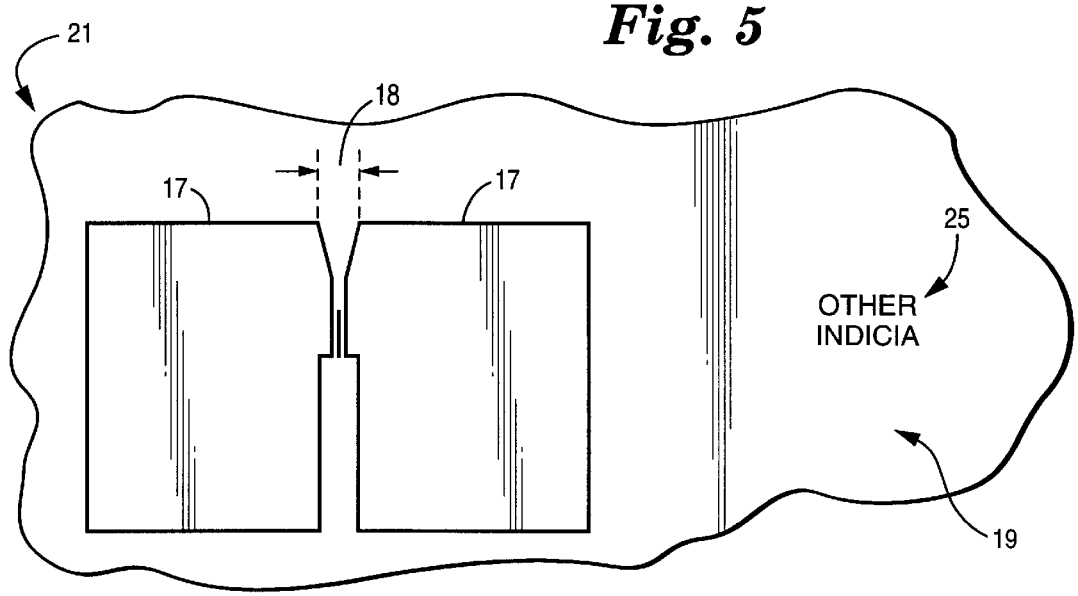
FIG. 5 is a top plan view of an exemplary RF antenna-containing element of either FIGS. 2 or 4.

An exemplary method according to the present invention is illustrated schematically by block diagrams in FIG. 1. In the practice of the method, as indicated schematically by box 10, an adhesive is pattern coated onto a substrate. The pattern coating may be accomplished utilizing any conventional pattern coating equipment for that purpose. The substrate is preferably a flexible and bendable substrate, such as paper or plastic sheet material, which may be in a web configuration during processing according to the method.

An exemplary substrate utilized in the practice of FIG. 1 is shown by reference numeral 11 in FIG. 2, having a top surface 12 and a bottom surface 13, with the adhesive 14 pattern coated on the top surface 12. One preferred material is paper card stock, although heavier weight paper, or lighter weight paper such as conventional bond paper, may be utilized. If plastic sheet material is utilized, preferably it is thin polyolefin, polypropylene, or like plastic sheet material that will adhere to an adhesive, and is flexible and bendable. Preferably any substrate material used is flexible enough so that it can be in web form and handled by conventional web handling equipment such as rollers, coaters, printers, or the like.

While a wide variety of adhesives 14 can be used depending upon the ultimate processing to be employed, preferably a pressure sensitive adhesive is utilized as the adhesive 14 for pattern coating on the top surface 12 of the substrate 11. Either permanent or removable hot melt adhesive is particularly desirable, and it is preferably applied at a coating weight of between about 3–6 pounds per 17 inch by 22 inch by 500 sheet ream (that is 3–6 pounds of adhesive are applied to a surface area that is 17 inches by 22 times 500, although because of the pattern coating the adhesive elements will be widely spaced, and a much larger area of substrate will contain the 3–6 pounds of adhesive than 17 inches by 22 inches times 500). For example exemplary pressure sensitive adhesives are permanent hot melt adhesive H2463-01 or removable hot melt adhesive HL-2612 both available from Ato Findley Inc. of Wauwatosa, Wis.

The next procedure in the method of FIG. 1, schematically illustrated by box 15 therein, is to laminate conductive foil or film onto the adhesive 14. The conductive foil or film may be almost any type of conductive foil or film that is capable of providing a high grade antenna for RFID transmission that is thicker and more conductive in use than most or all conductive printing inks. While a wide variety of conventional foils and films may be utilized, one particularly suitable one may be metallic color conductive films available from Foilmark, Inc. of Newburyport, Mass., and having a thickness of between about 0.3–1 mil.

As indicated schematically by box 16 in FIG. 1, after the conductive foil or film has been applied onto the adhesive 14 the portions of the foil or film that do not stick to the adhesive 14 are removed as indicated at 16. For example the procedures 15, 16 may be accomplished by unwinding a web of conductive foil or film so that it engages the adhesive 14, passing the substrate with adhesive and film between conventional rollers or other conventional equipment that applies pressure sufficient to ensure adhesion of the foil or film to the adhesive, and then rewinding the foil or film web onto a take-up roll, the foil or film automatically tearing and breaking where it is not adhered to adhesive 14, so that the conductive foil or film remains only where connected and adhered to adhesive 14 as illustrated schematically at 17 in FIG. 2.

All of the procedures 10, 15, 16, are practiced so that the adhesive 14 and the conductive foil or film 17 are in the form of a conventional radio frequency antenna configuration, having conductive portions of any configuration separated by a space or gap such as illustrated by the gap 18 in FIG. 2, showing RF antenna portions (17) on opposite sides thereof. If the substrate 11 is in web form then it is cut into a sheet of desired dimensions depending upon the ultimate use of the product (e.g. as a "Smart Tag" for use in a retail sales environment, an ID card, or the like) resulting in a final substrate with antenna as shown schematically at 19 in FIG. 2 and box 20 in FIG. 1.

Figure 6:
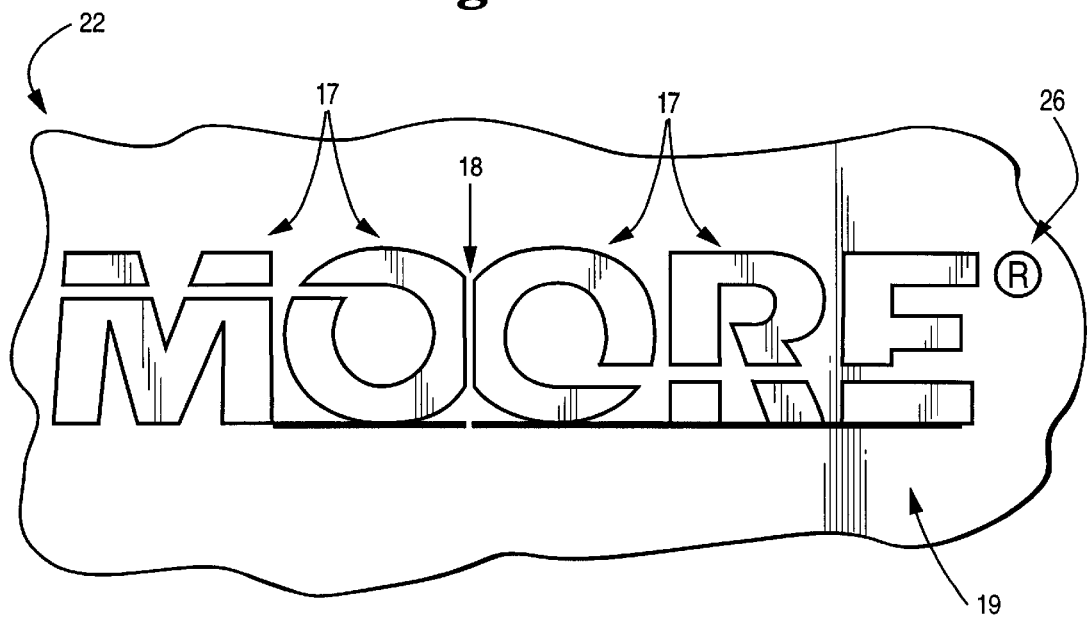
FIG. 6 is a view like that of FIG. 5 only showing a different configuration of the antenna.

FIGS. 5 and 6 illustrate two embodiments of antennas 21 (FIG. 5) and 22 (FIG. 6) that may be constructed. The antenna 21 of FIG. 5 has a conventional basically entirely functional configuration having two large conductive foil or film sections 17 spaced by the gap 18. A conventional radio frequency transponder chip (not shown), and other conventional RF elements, may be provided bridging the gap 18 and electrically connected to the antenna portions 17, as desired.

The antenna forming components 17, on opposite sides of the gap 18, in the FIG. 6 embodiment are in the configuration of words, letters, and/or numbers, or have another configuration that is aesthetic and/or does not clearly identify the element 17 as a part of an RF antenna.

The final substrates 19 of FIGS. 2, 5, and 6 also may have other indicia associated therewith aside from what is provided by (if any) the antenna elements 17. For example other indicia in the form of ink or toner is indicated schematically 25 in FIG. 5, and as also indicated schematically at 26 in FIG. 6. Rather than being simple ink or toner the indicia 25, 26 may have a foil or film outer surface and be made in the same way as the antenna elements 17.

FIG. 3 illustrates another exemplary method according to the present invention which will produce final substrates with antennas as indicated schematically at 119 in FIG. 4, which in top plan view would look identical to those in FIGS. 5 and 6. To practice the method of FIG. 3 preferably the equipment and general procedures such as shown in U.S. Pat. No. 5,520,763 are employed. In FIG. 4 components the same as those in FIG. 2 are shown by the same reference numeral only preceded by a "1".

In the method of FIG. 3, first toner (conductive or non-conductive) is printed on a web, as illustrated schematically at 30 in FIG. 3. The toner is printed in configuration that is in the form of a pattern of a radio frequency antenna (for example in the forms illustrated in FIGS. 5 and 6), and the toner is illustrated schematically at 31 in FIG. 4. That is the toner 31 will be directly on the top face 112 of the substrate/web 111 just like the adhesive 14 was directly in contact with the top surface 12 of the substrate 11 in the FIG. 2 embodiment.

The next procedure in the method of FIG. 3, as indicated schematically by box 32 therein, is to apply heat to the toner 31 so as to make it tacky. The heat application is practiced utilizing equipment such as in the U.S. Pat. No. 5,520,763 and may be only at those portions of the substrate/web 111 that conductive foil or film ultimately will be applied to, rather than the entire width of the web or substrate.

Next, as indicated schematically at 33 in FIG. 3, a laminate with conductive foil or film and adhesive (which may have a release liner covering the adhesive), again as shown in U.S. Pat. No. 5,520,763 may be utilized to be applied to the tacky toner 31. The adhesive is shown generally by reference number 114 in FIG. 4, and the conductive foil or film by reference numeral 117. As indicated schematically at 34 in FIG. 3 heat and/or pressure are applied so as to bond the adhesive 114 and the tacky toner 31 together, and then the web of foil or film is taken up as indicated schematically at 35 in FIG. 3, both the procedures 34, 35 utilizing equipment as illustrated in the U.S. Pat. No. 5,520,763, resulting in the production of the final web with antenna as indicated schematically at 36 in FIG. 3 and as shown schematically at 119 in FIG. 4. The web is then cut into the appropriate size for the ultimate function of the RF element. All of the procedures as illustrated in FIG. 3 may be particularly adapted so as to produce final radio frequency antenna-containing elements such as illustrated in FIGS. 5 and 6, and as described above with respect to the FIGS. 1 and 2 embodiments.

Depending upon the use to which the ultimate RF antenna-containing element 19, 119 is put, other processing may be provided. For example the bottom surface 13, 113 of the substrate 11, 111 may be coated, or partially coated, with an adhesive where the element 19, 119 is to act as a label or the like, or other processing may be provided as necessary or desirable.

Both of the methods of FIGS. 1 and 3, because they typically use conventional web handling equipment and are much quicker than etching or stamping procedures, can be practiced at high speed while still producing very high grade RF antennas. Both of the methods of FIGS. 1 and 3 may be practiced at at least 50 feet per minute (web speed), and typically over about 100 feet per minute.

The invention also specifically covers all narrower ranges within the broad ranges recited. For example "between about 0.3–1 mil" means 0.35–0.55 mil, 0.85–1 mil, 0.45–0.65 mil, and all other narrower ranges within the broad range.

While the invention has been herein shown and described in what is presently conceived to be the most practical and preferred embodiment thereof it will be apparent to those of ordinary skill in the art that many modifications may be made thereof within the scope of the invention, which scope is to be accorded the broadest interpretation of the appended claims so as to encompass all equivalent products and processes.

What is claimed is:

1. A radio frequency antenna-containing element comprising:
   a flexible substrate having a top surface;
   adhesive in a radio frequency antenna configuration operatively connected to said top surface;
   a conductive foil or film operatively connected to said adhesive so as to have substantially the same configuration thereof, and on the opposite side of said adhesive from said top surface; and
   said conductive foil or film having a radio frequency antenna configuration and said substrate with said adhesive and foil or film being flexible and bendable without destroying said substrate or antenna configuration of said foil or film.

2. A radio frequency antenna-containing element as recited in claim 1 wherein said substrate comprises paper.

3. A radio frequency antenna-containing element as recited in claim 1 wherein said adhesive comprises hot melt pressure sensitive adhesive.

4. A radio frequency antenna-containing element as recited in claim 3 wherein said adhesive substantially directly adheres to said substrate and said conductive foil or film.

5. A radio frequency antenna-containing element as recited in claim 1 wherein said adhesive and conductive foil or film configurations have the configurations of letters or numbers.

6. A radio frequency antenna-containing element as recited in claim 1 further comprising toner disposed between said substrate top surface and said adhesive, said toner having substantially the same configuration as said adhesive and conductive foil or film.

7. A radio frequency antenna-containing element as recited in claim 6 wherein said toner, adhesive and conductive foil or film configurations have the configurations of letters or numbers.

8. A radio frequency antenna-containing element as recited in claim 1 wherein said conductive foil or film has a thickness of between about 0.3–1 mil.

9. A radio frequency antenna-containing element as recited in claim 1 wherein said conductive foil or film comprises a conductive film having a metallic color and a thickness of between about 0.3–1 mil.

10. A radio frequency antenna-containing element as recited in claim 4 wherein said adhesive coat weight is between about 3–6 lbs per 17 inch by 22 inch by 500 sheet ream of substrate.

11. A method of making a radio frequency antenna-containing element comprising:
   (a) applying a pressure sensitive adhesive substantially directly to the top surface of a flexible substrate so that the adhesive is in the form of a pattern of a radio frequency antenna;
   (b) laminating a conductive foil or film to the adhesive on the top face of the substrate; and
   (c) removing the conductive foil or film from the top face of the substrate except for where the conductive foil or film adheres to the adhesive, to produce a flexible substrate having a flexible radio frequency antenna adhered thereto.

12. A method as recited in claim 11 wherein (b) and (c) are practiced by bringing a sheet or web of the conductive foil or film into secure contact with the adhesive, and then taking up the web or sheet so that the portions of the web or sheet not engaging the adhesive are torn away from those portions of the web or sheet that do engage the adhesive.

13. A method as recited in claim 12 wherein (a) is practiced by applying a hot melt adhesive at a coat weight of between about 3–6 pounds per 17 inch by 22 inch by 500 sheet ream of substrate.

14. A method as recited in claim 13 wherein (b) is practiced utilizing a conductive foil or film, having a thickness of about 0.3–1 mil.

15. A method as recited in claim 11 wherein (a)–(c) are practiced so as to apply the adhesive and conductive foil or film so that they have the configurations of letters or numbers.

16. A method as recited in claim 11 wherein (b) is practiced to unwind a web of conductive foil or film to bring the web of conductive foil or film into contact with the adhesive, and (c) is practiced to rewind the web of conductive foil or film so that the portions of the web not engaging the adhesive are torn away from those portions of the web that do engage the adhesive.

17. A method of making a radio frequency antenna-containing element comprising:
   (a) printing a toner on the top surface of a flexible substrate so that the toner is in the form of a pattern of a radio frequency antenna;
   (b) heating the toner to make it tacky;
   (c) while the toner is tacky, applying a laminate of a conductive foil or film and adhesive onto the toner while heating and applying pressure, so that the adhesive and foil stick to the toner where they engage; and
   (d) removing the laminate from the substrate except for where the conductive foil or film and adhesive adhere to the toner, to produce a flexible substrate having a flexible radio frequency antenna operatively adhered thereto.

18. A method as recited in claim 17 wherein (a)–(d) are practiced so as to apply the adhesive and conductive foil or film so that they have the configurations of letters or numbers.

19. A method as recited in claim 17 Wherein (c) is practiced to unwind a web of a laminate of adhesive and conductive foil or film to bring the web into contact with the tacky toner, and (d) is practiced to rewind the laminate web so that the portions of the web not engaging the toner are torn away from those portions of the web that do engage the toner.

* * * * *